United States Patent [19]

Schauder et al.

[11] Patent Number: 5,712,587
[45] Date of Patent: Jan. 27, 1998

[54] APPARATUS AND METHOD FOR SIMULTANEOUSLY DEACTIVATING SERIES-CONNECTED SWITCHING DEVICES

[75] Inventors: Colin D. Schauder, Murrysville; Mark G. Gernhardt, Greensburg; Eric J. Stacey, Pittsburgh, all of Pa.

[73] Assignee: Electric Power Research Institute, Inc., Palo Alto, Calif.

[21] Appl. No.: 628,909

[22] Filed: Apr. 8, 1996

[51] Int. Cl.$^6$ .................................................. H03K 17/72
[52] U.S. Cl. .......................... 327/440; 327/261; 327/269; 327/441
[58] Field of Search .................................. 327/261, 265, 327/269, 276, 279, 286, 440, 441, 456, 460, 470; 307/116; 323/271

[56] References Cited

U.S. PATENT DOCUMENTS

| | | | |
|---|---|---|---|
| 3,551,739 | 12/1970 | Bossi | 315/200 |
| 3,567,972 | 3/1971 | Faust | 363/164 |
| 4,540,933 | 9/1985 | Teuling | 323/271 |
| 4,639,851 | 1/1987 | Johnson | 307/311 |
| 5,093,630 | 3/1992 | Sato | 323/210 |
| 5,616,970 | 4/1997 | Dittrich | 327/440 |

Primary Examiner—Timothy P. Callahan
Assistant Examiner—Jeffrey Zweizig
Attorney, Agent, or Firm—Flehr Hohbach Test Albritton & Herbert LLP; Willian S. Galliani

[57] ABSTRACT

An apparatus for use in the simultaneous deactivation of a set of series-connected switching devices includes gate command control logic to generate a gate command signal for application to a selected switching device of the set of series-connected switching devices. A command compensation circuit processes the gate command signal. The command compensation circuit includes a time differential measurement module that forms a time differential signal indicative of the time from the previous turn-off of the selected switching device and the previous turn-off of the last switching device in the set of series-connected switching devices. A time difference processing module of the command compensation circuit process the time differential signal and creates a delay signal. A delay module of the command compensation circuit delays the gate command signal in response to the delay signal. Each switching device of the set of series-connected switching devices includes a command compensation circuit. Consequently, the generated delay signals cause the series-connected switching devices to turn-off simultaneously.

18 Claims, 4 Drawing Sheets

APPARATUS AND METHOD FOR SIMULTANEOUSLY DEACTIVATING SERIES-CONNECTED SWITCHING DEVICES

BRIEF DESCRIPTION OF THE INVENTION

This invention relates generally to series-connected switching devices used in power systems. More particularly, this invention relates to a system for automatically introducing calculated delays into the path of gating commands for individual series-connected switching devices to ensure that the devices are shut-off at the same time.

BACKGROUND OF THE INVENTION

Solid state power electronics are used in a variety of power distribution applications, including dc-to-ac conversion in inverters, power factor correction, voltage regulation, and resonance damping. Each of these applications relies upon the rapid switching of solid state power electronic devices. Typically, the solid state power electronic devices, or switching devices, are connected in series to make a single switching valve.

The switching devices should operate in unison. That is, when a gate command signal is removed from a switching device, each switching device in the series string should start to block voltage (recover) at exactly the same instant. The consequences of improper switch coordination can be serious. For example, during switching device deactivation, if the first switching device is turned off (recovers) before the other switching devices in the string of switching devices, it is exposed to the full source voltage of the external circuit. This voltage level is usually far more than the maximum voltage rating for the individual switching device. Consequently, the switching device may be damaged and the subsequent operation of the series string of devices may be compromised.

FIG. 1 illustrates a circuit 20 including a set of series-connected switching devices. The circuit 20 includes valves 22A–22N. Each valve 22 includes a switching circuit 24 and a snubber circuit 26. The switching circuit 24 includes a switching device, typically implemented as a thyristor (T), and an anti-parallel diode (D1). The snubber circuit 26 includes a standard arrangement of resistors (R1, R2), capacitors (C1, C2) and a diode (D2) to limit the rate of change of voltage across its associated switching device. Each switching device is activated (turned on) and deactivated (turned off) through a standard gate drive circuit 30, which receives a gate command signal from standard gate command control logic 32.

While the snubber circuits 26 diminish the problem of improper switch coordination in series-connected switching devices, they do not eliminate the problem. The problem is difficult to resolve for a number of reasons. For example, there is a delay from the instant when deactivation is commanded by the gate command control logic 32 to the instant when the switching devices start to block voltage. This delay is attributable to the propagation time through the gate drive circuit 30 and the storage time of the switching device, which in turn depends on device characteristics, gate circuit impedance, gate drive negative voltage, and temperature. It is possible to match the nominal storage time of devices in a string closely and to adjust the gate impedances and gate drive voltages to be nearly identical, but this involves cost and inconvenience. Moreover, the setup can be subsequently affected by temperature and aging of components.

In view of the foregoing, it would be highly desirable to minimize the problem of imprecise switching of series-connected switching devices. Improved switching precision for series-connected switching devices can prevent individual switching device failure and subsequent inferior performance by series-connected switching devices. Ideally, improved switching performance would be attained without relying upon switching device physical characteristics, such as device manufacturer, device age, or operating temperature.

SUMMARY OF THE INVENTION

The invention includes a method of simultaneously deactivating a set of series-connected switching devices. The first step of the method is to measure a turn-off time for each switching device in a set of series-connected switching devices during a first switch activation cycle. The turn-off times are then processed to form a set of delay signals. The delays signals are used during a second switch activation cycle to alter the delivery times of individual gate command signals applied to the series-connected switching devices. That is, gate command signals associated with fast switching devices are processed to experience a relatively long delay, while gate command signals associated with slow switching devices are processed to experience a relatively short delay. Consequently, the set of series-connected switching devices are turned-off simultaneously.

The present invention prevents damage to series-connected switching devices during switch turn-off. Advantageously, the method does not rely upon switching device physical characteristics, such as device manufacturer, device age, or operating temperature. Consequently, poorly matched switching devices may be used in the same series-connected switching string. The method of the invention can be executed at every turn-off event, thereby adjusting for system changes as they occur.

BRIEF DESCRIPTION OF THE DRAWINGS for a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
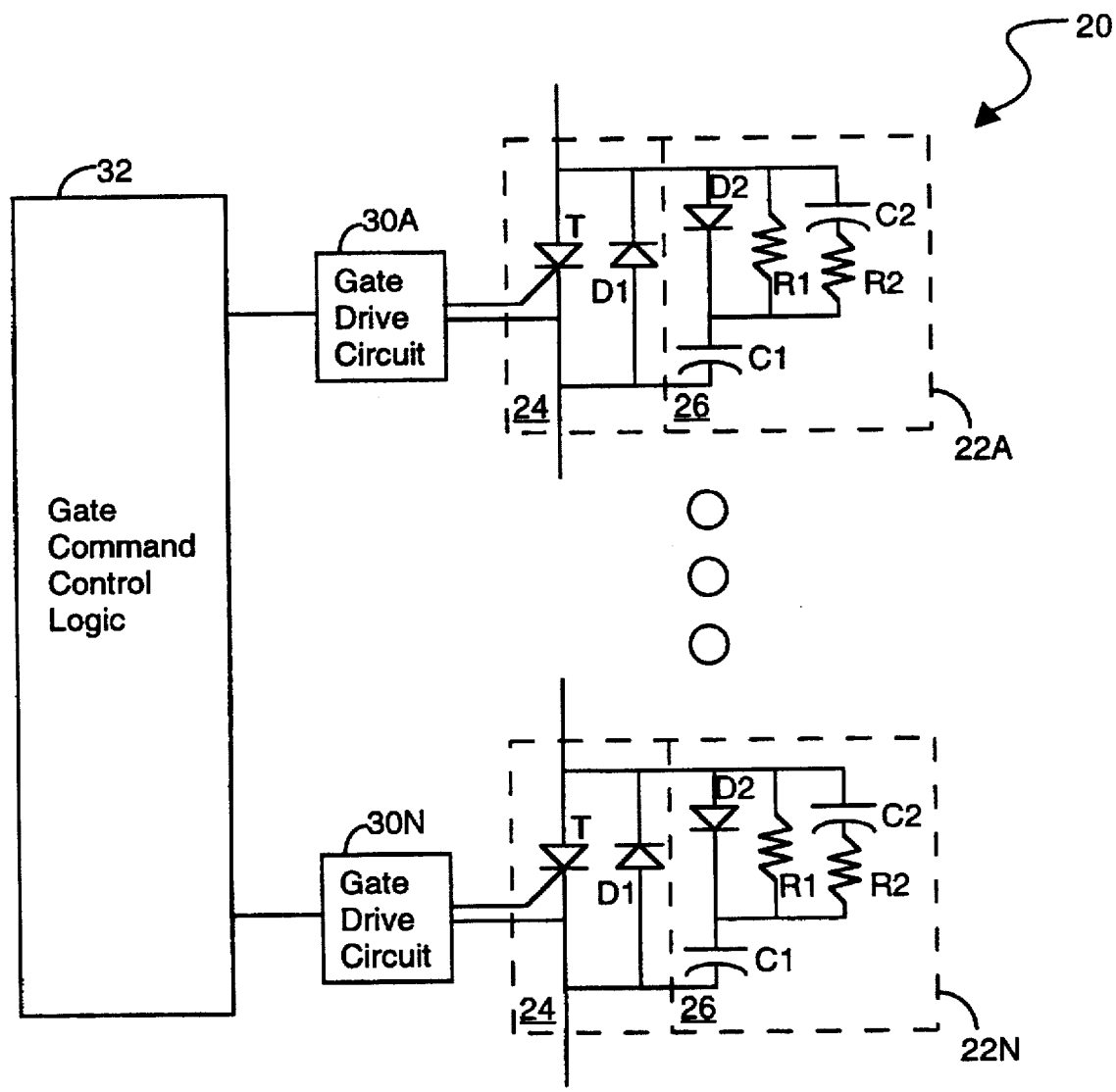
FIG. 1 illustrates a prior art configuration of series-connected switching devices.
Figure 2:
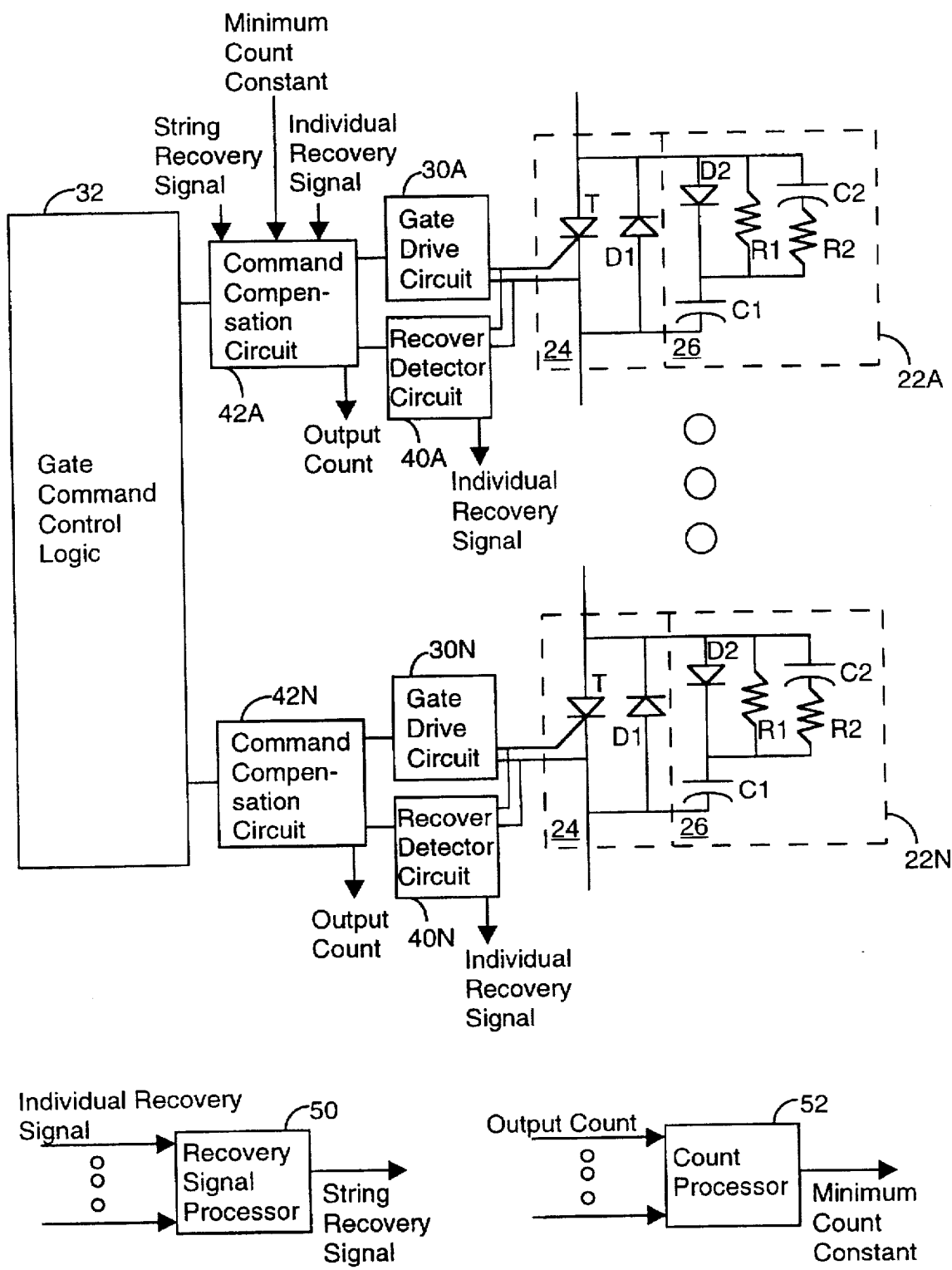
FIG. 2 illustrates a configuration of series connected switching devices in accordance with one embodiment of the invention.

FIG. 2 generally corresponds to the prior art configuration of series-connected switching devices shown in FIG. 1. However, in accordance with the invention, the prior art configuration of FIG. 1 is supplemented to include a set of recovery detector circuits 40A–40N, a set of command compensation circuits 42A–42N, a recovery signal processor 50, and a count processor 52.

By way of overview, the principle of the invention is to use the set of recovery detector circuits 40A–40N, the set of command compensation circuits 42A–42N, the recovery signal processor 50, and the count processor 52 to monitor the switching performance of individual switching devices in a set of series-connected switching devices. Disparities in the shut-off times of individual switching devices identified during a first switch activation cycle are compensated during a second switch activation cycle. For example, gate command signals applied to fast switching devices are processed during the second switch activation cycle to experience a relatively long delay, while gate command signals applied to slow switching devices are processed during the second switch activation cycle to experience a relatively short delay. Consequently, both the fast switching devices and the slow switching devices are shut-off at the same time, although the fast switching devices were commanded to turn-off at a later time than the slow switching devices.

Note that in the prior art system of FIG. 1 the fast switching devices quickly shut-off and are therefore exposed to damaging voltage levels before the slow switching devices are shut-off and share the voltage blocking load. On the other hand, in the system of FIG. 2, all switching devices are shut-off simultaneously. Consequently, individual switching devices in FIG. 2 are not exposed to damage. As indicated above, the technique of the invention does not rely upon switching device physical characteristics, such as device manufacturer, device age, or operating temperature. Consequently, poorly matched switching devices may be used in the same series-connected switching string. Moreover, the method of the invention can be executed at every turn-off event, thereby adjusting for system changes as they occur. The invention is also advantageous since it supplements known circuit topologies.

The general principle and benefits of the invention have now been described. Attention presently turns to particular embodiments of the invention. It will be appreciated by those skilled in the art that a large number of alternate embodiments may be used to embody the principles of the invention.

FIG. 2 illustrates a set of recovery detector circuits 40A–40N. Each recovery detector circuit operates to identify when its corresponding switching device is deactivated. That is, when its corresponding thyristor is turned off and is therefore blocking voltage. To achieve this functionality, the recovery detector circuit may be implemented in any number of ways. The rise of negative gate voltage may be used as an accurate indication of the deactivation of a thyristor. Thus, for example, each recovery detector circuit 40 may be implemented to identify when the negative gate voltage of its corresponding thyristor exceeds a predetermined threshold (for example, −20V). In response to this condition, the recovery detector circuit produces an individual recovery signal, indicating that the corresponding thyristor is shut-off. The recovery detector circuit 40 may also be implemented to measure other quantities, such as anode-cathode voltage. Regardless of the embodiment, the generated individual recovery signal is used to indicate that a switching device has shut-off.

Figure 3:
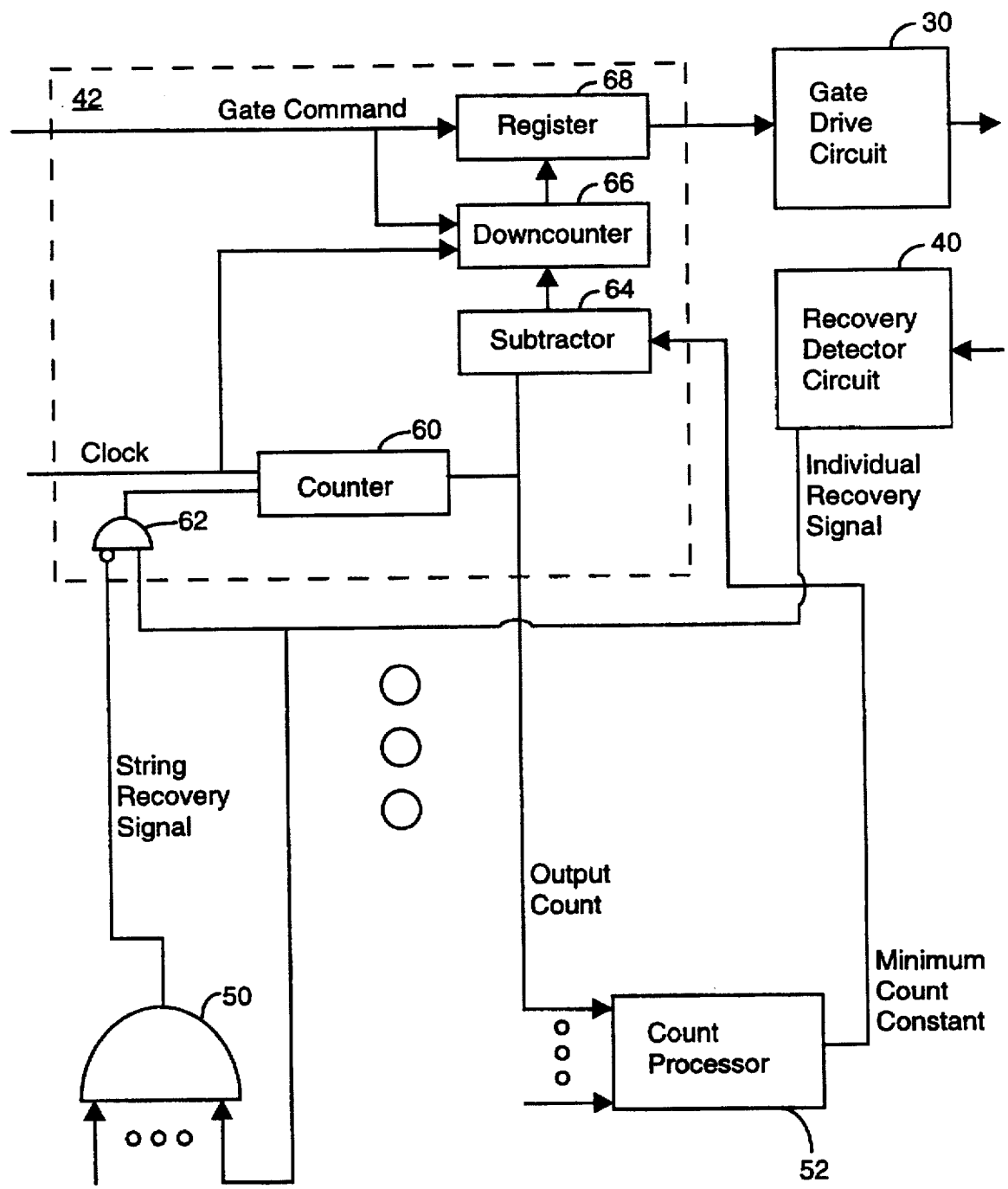
FIG. 3 illustrates a command compensation circuit and related circuitry that may be used in conjunction with the apparatus of FIG. 2.

As shown in FIG. 2, the individual recovery signals are applied to a recovery signal processor 50, which produces a string recovery signal when the last switching device in the set of series-connected switching devices shuts-off. FIG. 3 illustrates that the recovery signal processor 50 may be implemented as a multiple input logical AND gate.

FIG. 3 also illustrates the utilization of the individual recovery signal and the string recovery signal by a command compensation circuit 42. The command compensation circuit 42 includes a logical AND gate 62 to process the individual recovery signal and the string recovery signal. Note that the output of the AND gate 62 is a logical ONE when the individual recovery signal is present (as a logical ONE) and the string recovery signal is absent (a logical ZERO inverted at the AND gate to produce a logical ONE). A logical ONE output from the AND gate 62 activates counter 60.

Before activation, counter 60 holds an initial count that it held at the end of the previous switching cycle. This initial count was previously used to calculate the delay applied to the gating command of the individual switching devices. After activation, counter 60 increments its count on signal transitions from a high speed clock. The counter stops counting signal transitions from the high speed clock when the string recovery signal is present (as a logical ONE inverted at the AND gate to produce a logical ZERO). The string recovery signal, indicating that all switching devices are now shut-off, causes the output of the AND gate 62 to transition to a logical ZERO. At this point, the counter 60 holds a count that is greater than its initial count by an amount corresponding to the time differential between the turn-off of the individual switching device and the turn-off of the last switching device in the set of series-connected switching devices.

Each of the counters 60 associated with the N switching devices holds its own unique count. Note that if the devices all recovered simultaneously then the set of counts held by the counters 60 would be unchanged from the previous cycle. The differentials between these counts correspond to the differential timing delays that will be applied to the gating commands on the next cycle. The device associated with the lowest count is the slowest device and will have zero delay applied, and the device associated with the highest count is the fastest device and will have a delay applied corresponding to the difference between the highest and lowest counts. The other delays are similarly assigned in proportion to the difference between their associated counts and the lowest count. Note that this constitutes an ongoing corrective process. Provided that the counters 60 do not change their counts, the same delay set will be applied repetitively. A change in count, however, indicates a change in switching behavior and the applied delays will be updated accordingly on the next cycle to ensure simultaneous recovery of the string.

The output count from counter 60 is passed to a subtractor 64 and a count processor 52. As indicated in FIG. 3, the count processor 52 receives output count signals from each command compensation circuit 42. The count processor 52 identifies the smallest output count that it receives and outputs it as a minimum count constant. Preferably, the count processor 52 is implemented as a digital logic circuit.

As shown in FIG. 3, the minimum count constant signal is applied to subtractor 64. As a result, the minimum count constant signal is subtracted from the output count signal signal to produce a delay signal. If the delay signal has a small value, this means that the command compensation circuit 42 is associated with a slow switching device. Consequently, the delay signal will only result in a small delay of a gate command signal in a subsequent switch activation cycle. Conversely, if the delay signal has a large value, the command compensation circuit is associated with a fast switching device. To offset this fast switching action, the delay signal will be used to postpone the firing of the switching device.

FIG. 3 illustrates that the output of the subtractor, the delay signal, is applied to a digital down counter 66. The down counter 66 is activated by a gate command signal of a subsequent switch activation cycle. The same gate command signal is simultaneously stored in a register 68.

When activated, the down counter 66 decrements the delay signal value each clock cycle. When its value reaches zero, it generates an enable signal that is applied to register 68. Thereafter, the gate command signal stored in register 68 is passed to the gate drive circuit 30 and is subsequently passed to a switching device (not shown). Thus, the delay module formed by the down counter 66 and register 68 holds the gate command signal for a period of time corresponding to the value of the delay signal in the down counter 66. As indicated above, a large delay value results in a large delay for the gate command signal, while a small delay value results in a small delay for the gate command signal.

Figure 4:
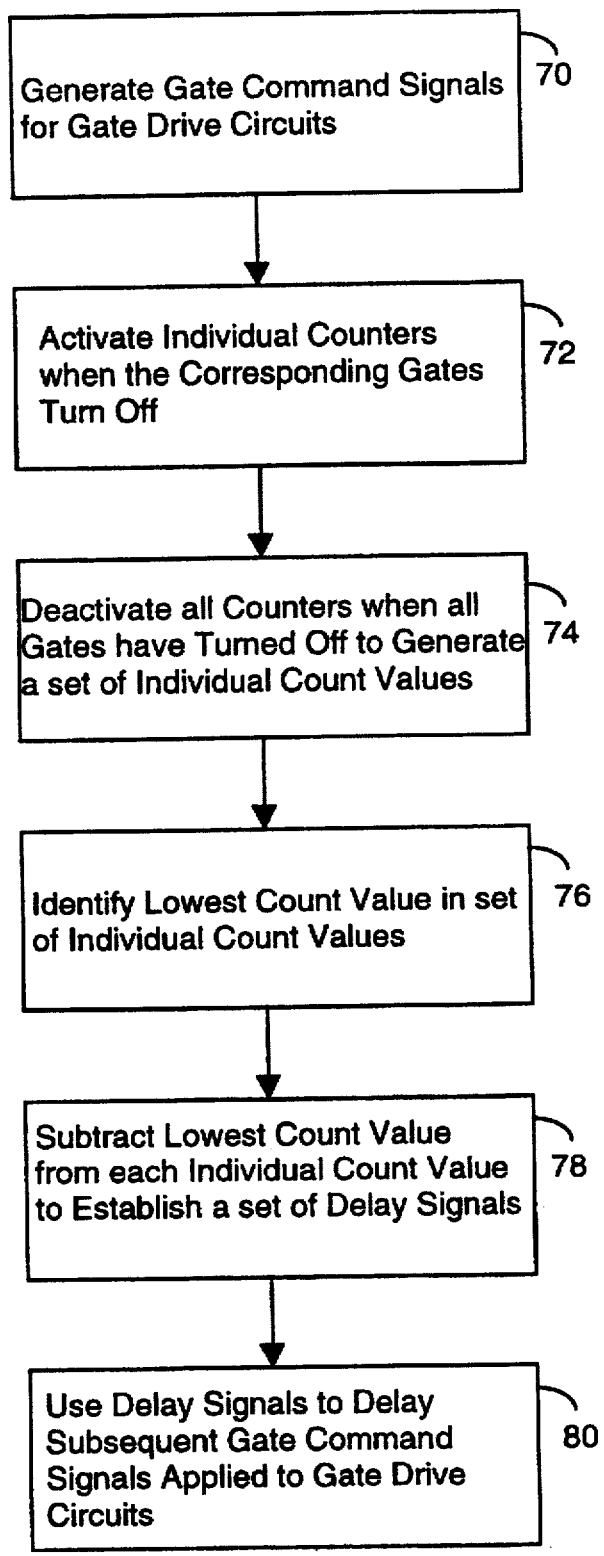
FIG. 4 illustrates processing steps associated with one embodiment of the invention.

The processing performed by the circuits of FIGS. 2 and 3 is more fully appreciated with reference to FIG. 4. FIG. 4 illustrates processing steps associated with one embodiment of the invention. The first processing step is to generate gate command signals for gate drive circuits (step 70) during a first switch activation cycle. Thereafter, individual counters 60 are activated as their corresponding gates are turned-off (step 72). Each of the counters runs until all counters are deactivated when all the gates have turned-off (step 74). This results in a set of individual count values (step 74). Subsequently, the lowest count value is identified from the set of individual count values (step 76). As indicated above, this value may be identified with a count processor 52.

The next processing step is to subtract the minimum count constant (the lowest count value) from each output count (time differential signal) to establish a set of delay signals (step 78). Relying upon the embodiment of FIG. 3, the subtractor 64 of each command compensation circuit 42 is used to calculate the difference between the minimum count constant and the time differential signal.

The final processing step of FIG. 4 is to use the delay signals to delay subsequent gate command signals (a second switch activation cycle) applied to the gate drive circuits (step 80). Again relying upon the embodiment of FIG. 3, the delay signal is processed in the down counter 66 of each command compensation circuit 42 to produce an enable signal that is applied to register 68, allowing the gate command signal to be passed to the gate drive circuit 30.

Those skilled in the art will recognize a number of alternate embodiments within the scope of the present invention. For example, the digital circuitry of FIG. 3 may be implemented with analog circuitry or in software. Similarly, other approaches that do not rely upon a counter and a minimum count constant may be used. The delay operation may be executed by the gate command control logic 32, instead of relying upon discrete command compensation circuits 42.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. An apparatus to simultaneously deactivate a set of series-connected switching devices, comprising:

a set of series-connected switching devices;

a set of recovery detector circuits, connected to said set of series-connected switching devices, to measure a set of recovery signals indicative of the turn-off times of said set of series-connected switching devices during a first switch activation cycle; and control circuitry to process said set of recovery signals and apply a predetermined delay to individual gate command signals in a set of gate command signals applied to said set of series-connected switching devices during a second switch activation cycle, such that said set of series-connected switching devices is simultaneously deactivated.

2. The apparatus of claim 1 wherein said control circuitry includes:

gate command control logic to generate said set of gate command signals; and a set of command compensation circuits to provide said predetermined delay to individual gate command signals in said set of gate command signals.

3. The apparatus of claim 2 wherein each command compensation circuit of said set of command compensation circuits is connected to a selected switching device of said set of series-connected switching devices, each command compensation circuit including:

a time differential measurement module to form a time differential signal indicative of the time from the turn-off of said selected switching device and the turn-off of the last switching device in said set of series-connected switching devices during said first switch activation cycle, a time difference processing module to process said time differential signal and create a delay signal, and a delay module to delay an individual gate command signal of said set of gate command signals in accordance with said delay signal during said second switch activation cycle.

4. The apparatus of claim 3 wherein said time differential measurement module includes a counter that is activated by an individual recovery signal indicative of said turn-off of said selected switching device and is deactivated by a string recovery signal indicative of the turn-off of said last switching device in said last set of series-connected switching devices.

5. The apparatus of claim 3 wherein said time difference processing module includes a subtractor to subtract a minimum count constant from said time differential signal to create said delay signal.

6. The apparatus of claim 5 wherein said minimum count constant is generated by a count processor, said count processor including input nodes to receive a time differential signal from each switching device in said set of series-connected switching devices, and a logic module to select the smallest time differential signal, said smallest time differential signal corresponding to said minimum count constant.

7. The apparatus of claim 3 wherein said delay module includes a down counter to process said delay signal and generate an enable signal; and a register to store said gate command signal until said enable signal is generated.

8. The apparatus of claim 3 further comprising a gate drive circuit connected between said delay module and said selected switching device.

9. The apparatus of claim 3 wherein each recovery detector circuit of said set of recovery detector circuits generates an individual recovery signal when a negative gate voltage of said series connected switching device exceeds a predetermined threshold.

10. The apparatus of claim 9 further comprising a recovery signal processor connected between said recovery detector circuit and said command compensation circuit, said recovery signal processor receiving said individual recovery signal from said recovery detector circuit and selectively generating said string recovery signal for application to said command compensation circuit.

11. The apparatus of claim 10 wherein said recovery signal processor includes a set of input nodes to receive said set of recovery signals from said set of recovery detector circuits and in response thereto selectively generates said string recovery signal.

12. A method of simultaneously deactivating a set of series-connected switching devices, said method comprising the steps of:

measuring, during a first switch activation cycle, a turn-off time for each switching device in a set of series-connected switching devices;

processing said turn-off time for each switching device to form a set of delay signals; and applying, during a second switch activation cycle, said delay signals to a set of gate command signals to cause said set of series-connected switching devices to simultaneously turn-off.

13. The method of claim 12 wherein said measuring step includes the step of measuring said turn-off time for each switching device by measuring the time between the turn-off of each switching device and the turn-off of the last switching device in said set of series-connected switching devices.

14. The method of claim 12 wherein said processing step includes the step of identifying the smallest turn-off time measured during said measuring step; and subtracting said smallest turn-off time from the remaining times measured during said measuring step to form said set of delay signals.

15. A method of simultaneously deactivating a set of series-connected switching devices, said method comprising the steps of:

applying a set of gate command signals to a set of series-connected switching devices;

activating a counter at each series-connected switching device when its corresponding series-connected switching device turns-off;

deactivating each counter at each series-connected switching device when the last series-connected switching device turns off to thereby produce a set of individual count values;

identifying the lowest count value in said set of individual count values;

subtracting said lowest count value from each individual count value of said set of individual count values to form a corresponding set of delay signals; and using said set of delay signals to form gate delays for a subsequent set of gate command signals applied to said series-connected switching devices, thereby causing said series-connected switching devices to be simultaneously deactivated.

16. The method of claim 15 wherein said applying step includes the step of generating said gate command signals with gate command control logic.

17. The method of claim 15 wherein said deactivating step includes the step of deactivating each counter with a string recovery signal generated by a digital logic recovery signal processor.

18. The method of claim 15 wherein said identifying step includes the step of identifying said lowest count value with a digital logic count processor.

* * * * *